(12) United States Patent
Dittrich

(10) Patent No.: US 7,706,176 B2
(45) Date of Patent: Apr. 27, 2010

(54) INTEGRATED CIRCUIT, CELL ARRANGEMENT, METHOD FOR MANUFACTURING AN INTEGRATED CIRCUIT AND FOR READING A MEMORY CELL STATUS, MEMORY MODULE

(75) Inventor: Rok Dittrich, Paris (FR)

(73) Assignees: Qimonda AG, Munich (DE); Altis Semiconductor, SNC, Corbeil Essonnes (FR)

( * ) Notice: Subject to any disclaimer, the term of this patent is extended or adjusted under 35 U.S.C. 154(b) by 151 days.

(21) Appl. No.: 11/970,302

(22) Filed: Jan. 7, 2008

(65) Prior Publication Data

US 2009/0175108 A1 Jul. 9, 2009

(51) Int. Cl.
*G11C 11/00* (2006.01)
(52) U.S. Cl. ............... 365/158; 365/185.02; 365/210.15
(58) Field of Classification Search ............. 365/210.15
See application file for complete search history.

(56) References Cited

U.S. PATENT DOCUMENTS 4,961,166 A * 10/1990 Sato et al. .................. 365/207
5,299,165 A * 3/1994 Kimura et al. .............. 365/207
5,339,274 A 8/1994 Dhong et al.
6,252,793 B1 6/2001 Allen et al.
6,363,027 B1 * 3/2002 Komatsu ............... 365/230.03
6,418,044 B1 7/2002 Laurent
6,545,899 B1 4/2003 Derner et al.
6,760,251 B2 * 7/2004 Hidaka ...................... 365/171
6,856,565 B2 * 2/2005 Ooishi et al. ................ 365/207
6,922,355 B2 * 7/2005 Hidaka ...................... 365/158
7,102,921 B2 * 9/2006 Anthony et al. ............. 365/171
7,339,817 B2 * 3/2008 Nickel et al. ................ 365/158
7,349,243 B2 * 3/2008 Lin et al. .................... 365/158
7,511,990 B2 * 3/2009 Chung et al. ................ 365/158

OTHER PUBLICATIONS

Au, E.K.S., et al., "A Binary-Search Switched-Current Sensing Scheme for 4-state MRAM," GLSVLSI '04, Apr. 26-28, 2004, pp. 304-307, ACM.

* cited by examiner

*Primary Examiner*—Tan T. Nguyen

(57) ABSTRACT

An integrated circuit having a cell arrangement is provided. The cell arrangement may include a memory cell and a reference cell. The memory cell has a first memory cell status and a second memory cell status. The reference cell is set to an intermediate memory cell status between the first memory cell status and the second memory cell status.

14 Claims, 8 Drawing Sheets

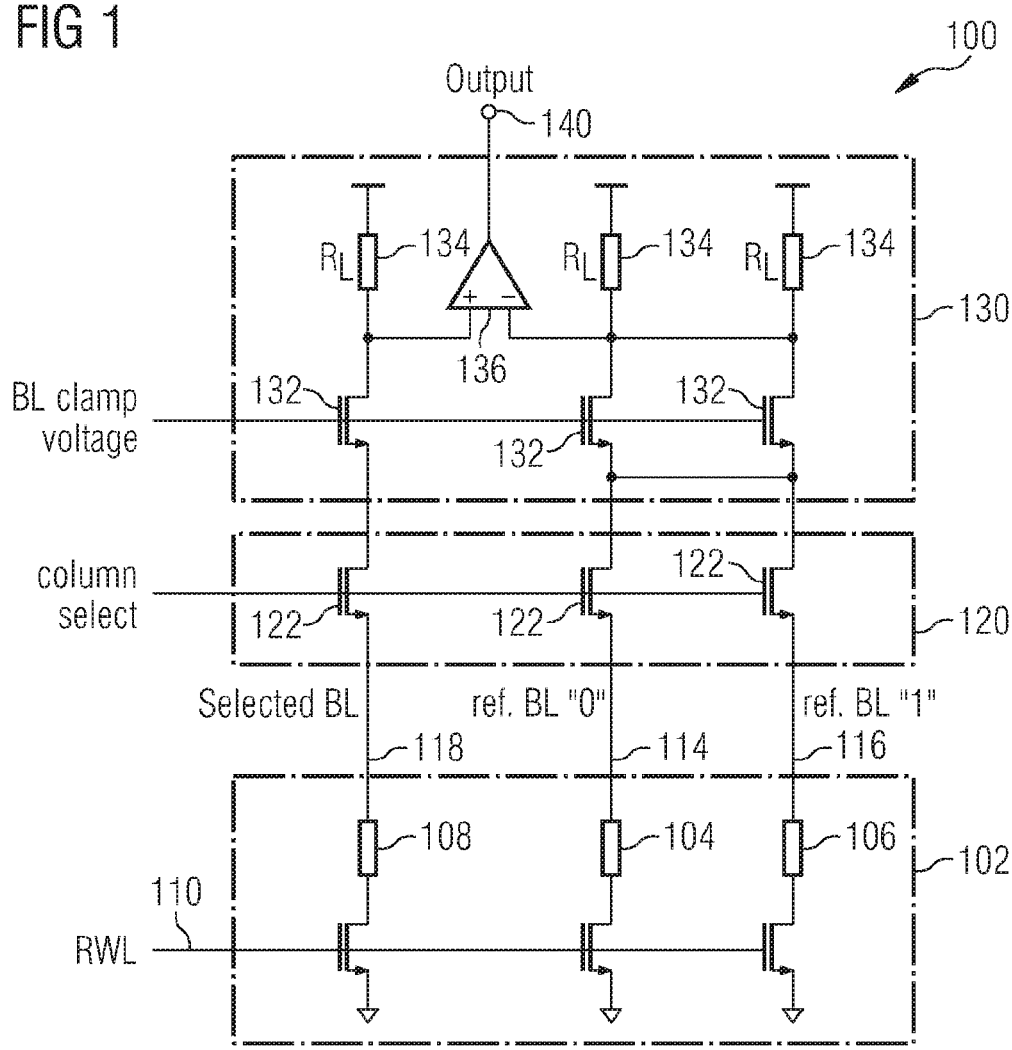

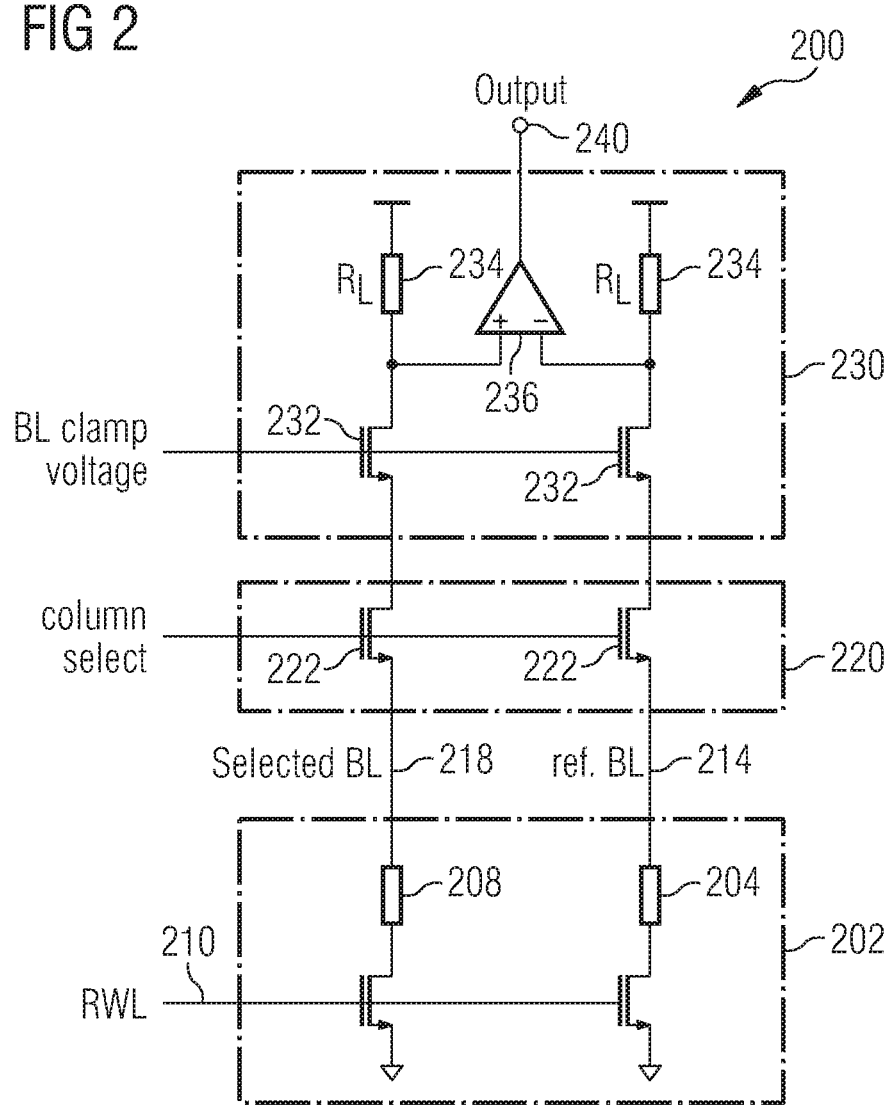

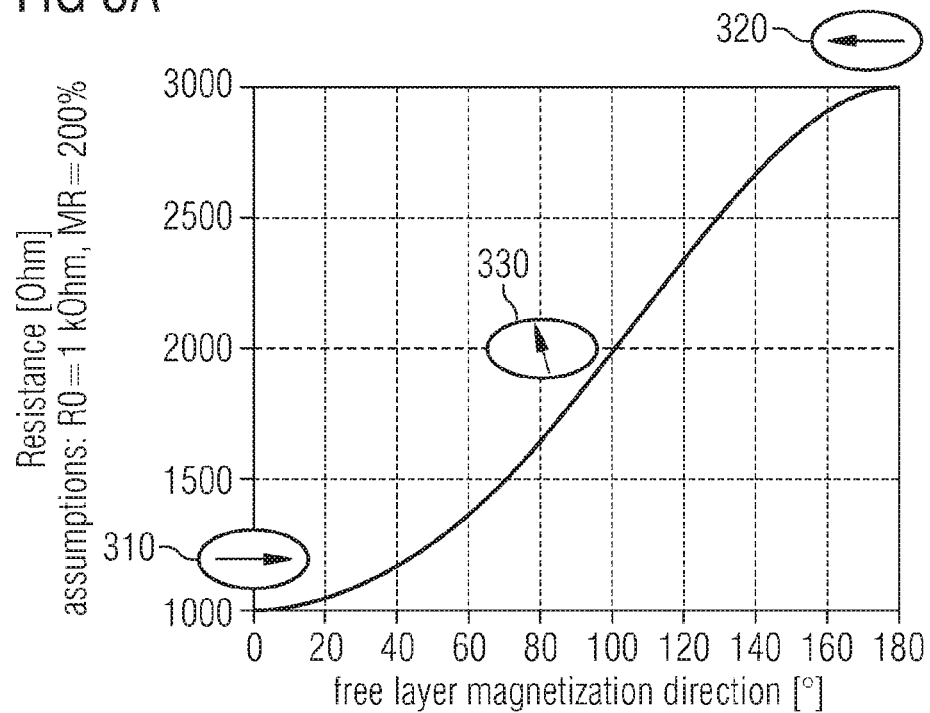
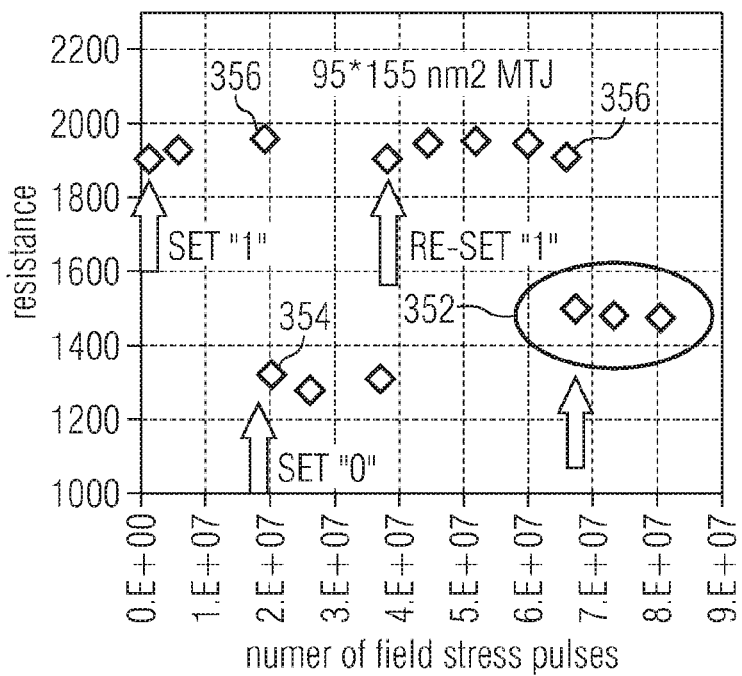

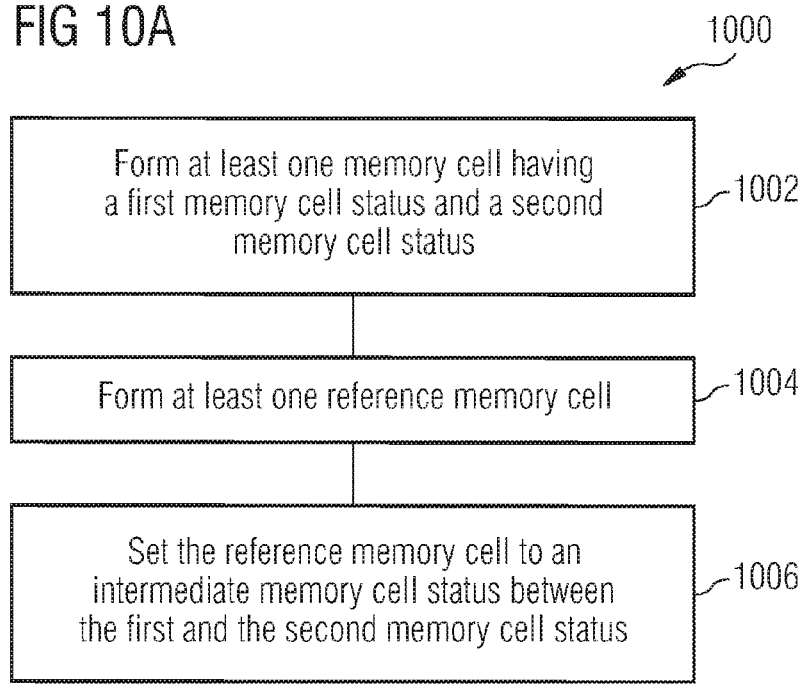
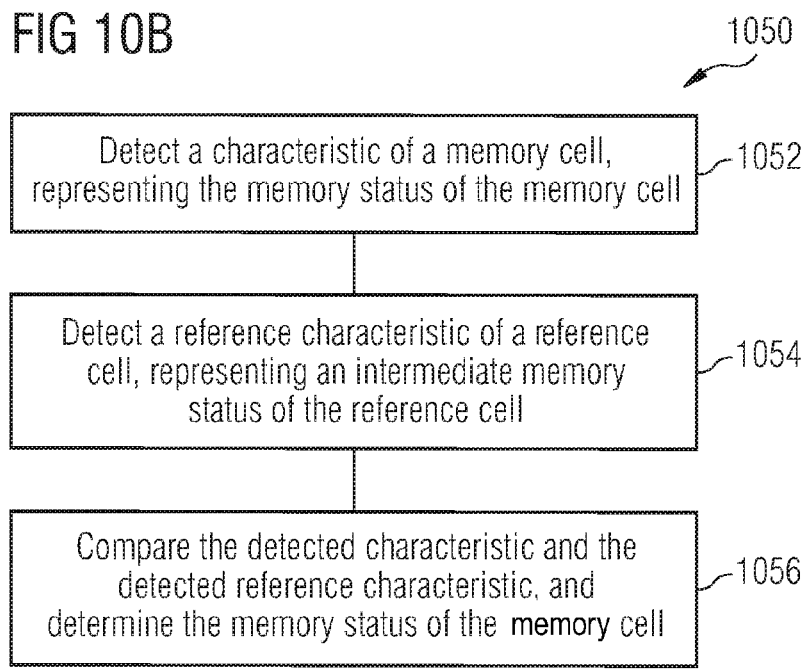

US 7,706,176 B2

INTEGRATED CIRCUIT, CELL ARRANGEMENT, METHOD FOR MANUFACTURING AN INTEGRATED CIRCUIT AND FOR READING A MEMORY CELL STATUS, MEMORY MODULE

TECHNICAL FIELD

Embodiments of the invention relate generally to an integrated circuit, a cell arrangement, a method for manufacturing an integrated circuit, a method for reading a memory cell status, and a memory module.

BACKGROUND

Recent developments in spin electronics have enabled the emergence of a new class of non-volatile memories, magnetic random access memories (MRAM). In general, MRAM exploits the electromagnetic properties of magnetoresistive materials to set and maintain information stored within individual magnetic memory cells, also called magnetic tunnel junctions (MTJ). More specifically, digital information is stored within a magnetic memory cell as a bit, the state of which is indicated by the direction of magnetization within one magnetic layer of the memory cell relative to another magnetic layer of the memory cell. A typical magnetic memory cell may comprise two magnetic layers sandwiching a tunnel barrier layer. One magnetic layer has a fixed magnetic orientation, which may be referred to as the pinned magnetic layer or the reference layer. The reference layer serves as a reference for another magnetic layer within the cell. The other magnetic layer, also referred to as a free magnetic layer or storage layer, can be adapted to change its magnetic orientation relative to the reference layer such that logic states of a bit may be stored within the magnetic tunnel junction.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a two-reference-cell design of an integrated circuit according to one embodiment of the invention;

FIG. 2 shows a one-reference-cell design of an integrated circuit according to one embodiment of the invention;

FIGS. 3A and 3B show an intermediate memory cell status of a reference memory cell according to one embodiment of the invention;

FIG. 10A shows a flowchart illustrating a method in accordance with one embodiment of the invention;

FIG. 10B shows a flowchart illustrating a method in accordance with another embodiment of the invention.

DETAILED DESCRIPTION OF ILLUSTRATIVE EMBODIMENTS

Figure 4:
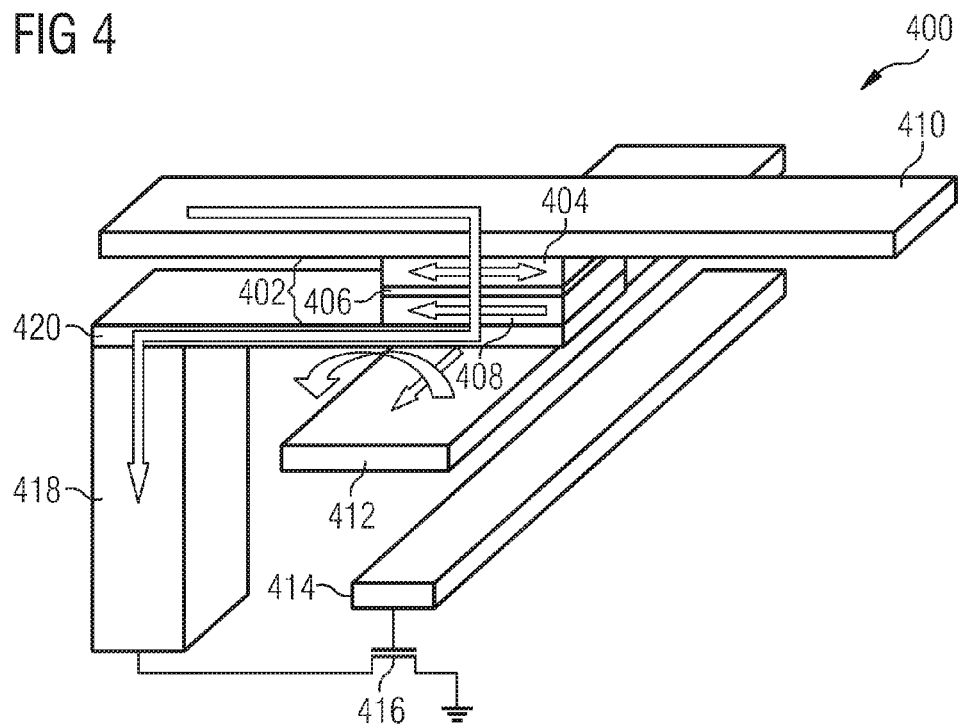
FIG. 4 shows a memory cell according to one embodiment of the invention.

One type of MRAM called thermal select MRAM is capable of being programmed with lower power consumption by heating the selected memory cells. In general, the storage layer and the reference layer of the MTJ each may be pinned by an antiferromagnetic layer structure having a blocking temperature. By way of example, the antiferromagnetic materials of the storage layer and the reference layer are chosen to have large differences in their respective blocking temperature. When the MTJ is heated to a temperature exceeding the lower blocking temperature (of the antiferromagnetic layer structure of the storage layer), the antiferromagnetic layer of the storage layer is freed such that the magnetization direction of the storage layer can be easily switched under the application of a small magnetic field.

In a typical 1T1MTJ (one transistor, one MTJ) architecture of an MRAM array, each MTJ may be placed at the intersection of conductive lines, referred to as bit lines and write word lines (WWL). The MRAM array further includes read word lines (RWL), arranged parallel to write word lines and perpendicular to bit lines. Each MTJ may be connected in series with a transistor, the gate of which is connected to the read word lines for selecting the MTJ for the read operation.

Typically, reference cells are used to read the data stored in MTJs. The current associated with the data MTJ is sensed and compared with the current associated with reference MTJs which have been pre-programmed to known states. A two-reference-cell design may be used, wherein the two reference cells may be pre-programmed to opposite states (e.g., a logic "0" and a logic "1", respectively). The average of the two reference cell currents is used as the reference.

FIG. 1 shows a two-reference-cell design 100 of an MRAM device according to one embodiment of the invention. A memory cell array 102 includes a plurality of memory cells, including data cells for storing data and reference cells to be used in a reading operation. At least two MTJ reference cells 104 and 106 are provided in order to read the memory cell status of a data cell 108, as shown in FIG. 1. The first reference cell 104 and the second reference cell 106 are respectively programmed with a memory cell status logic "0" and logic "1", and are connected with the data cell 108 through a read word line (RWL) 110. The two reference cells 104 and 106 connected to the same read word line 110 may generate a reference value intermediate between a reference current representing a logic "0" and a reference current representing a logic "1" (in other words, an intermediate reference current).

The reference cells 104, 106 and the data cell 108 are connected to a first reference bit line "0" 114 (which may be coupled to the first reference cell 104), a second reference bit line "1" 116 (which may be coupled to the first reference cell 106), and a bit line 118, respectively. In an embodiment of the invention, the first reference bit line "0" 114 may be connected to a plurality of reference cells programmed with "0" with each reference cell connected to a different read word line 110, and the second reference bit line "1" 116 may be connected to a plurality of reference cells programmed with "1" with each reference cell connected to a different read word line 110. The reference cells 104 and 106 connected to the same read word line 110 may be used as the reference for all the data cells 108 connected to the same read word line 110, thereby achieving a high density of the MRAM device.

A column selector 120 is connected to the reference bit lines 114, 116 and the bit lines 118, and selects the respective bit line 118 and reference bit lines 114, 116 by applying a column select signal to a respective transistor 122 connected to the respective bit line 118 and reference bit line 114, 116. When the selected RWL 110 is driven high, the data cell 108 and the reference cells 104, 106 are connected to their respective selected bit line 118, and reference bit line 114, 116. A sense amplifier 130 is connected to three bit lines 118 and reference bit lines 114, 116 via the column selector 120, wherein the sense amplifier 130 comprises a plurality of bit line clamp transistors 132 (wherein in an embodiment of the invention, one bit line clamp transistor 132 may be provided for each of the bit lines 118 and for each reference bit line 114, 116). The bit line clamp transistors 132 are gated by a bit line clamp voltage, and hold the bit lines 118 and the reference bit lines 114, 116 at the desired read voltage. The drain of each bit line clamp transistor 132 may be connected to a load device $R_L$ 134. The load devices $R_L$ 134 serve to convert the current signal into a voltage signal that is sensed by a differential voltage amplifier 136 to obtain a sense amplifier output signal 140, representing the memory cell status of the selected data cell 108, wherein the sense amplifier output signal 140 may be provided at an output.

The above architecture for reading an MRAM device, however, typically provides for at least two reference cells to generate an intermediate reference. Moreover, in an MRAM device with multi-level or multi-bit memory cells, more reference cells would be provided to generate more than one intermediate reference between a maximum resistance value $R_{max}$ and a minimum resistance value $R_{min}$. This would limit the density of the MRAM device and require higher power consumption of the MRAM device.

Embodiments of the present invention provide reference memory cells programmed with intermediate memory cell status in order to simplify the circuit integration, improve the memory cell density and save the power consumption.

One embodiment of the present invention relates to an integrated circuit having a cell arrangement, wherein the cell arrangement includes at least one memory cell and at least one reference cell. The at least one memory cell may have at least a first memory cell status and a second memory cell status. The at least one reference cell may be set to an intermediate memory cell status between the first memory cell status and the second memory cell status.

In one embodiment, the memory cell of the cell arrangement is a multi-level memory cell. Multi-level memory cell refers to the ability of a single memory cell to store or represent more than a single bit of data. A multi-level memory cell may store 2, 4, 8... etc. bits in a single storage location. For example, the multi-level memory cells are configured to store a plurality of bits by showing distinguishable threshold voltages dependent on the amount of electric charge stored in the memory cell, thereby representing a plurality of logic states. In another example, the multi-level memory cells are configured to store a plurality of bits by showing distinguishable resistance of the memory cell dependent on the magnetization orientation of a storage layer relative to that of a reference layer in the memory cell.

In another embodiment, the memory cell is a multi-bit memory cell. Multi-bit memory cell is intended to include memory cells which are configured to store a plurality of bits by spatially separated electric charge storage regions in one example and by separated data storage layers in another example, thereby representing a plurality of logic states.

The memory cell and the reference memory cell may be selected to be of the same type of memory cell. For example, the memory cell is selected to be a magnetoresistive memory cell. The reference memory cell may also be a magnetoresistive reference memory cell.

In one embodiment, the magnetoresistive memory cell includes a magnetic tunnel junction (MTJ) cell having a storage layer, a tunnel layer and a reference layer. The storage layer and the reference layer may be made from magnetic materials, examples of which include but are not limited to nickel iron, nickel iron cobalt, cobalt iron, cobalt zirconium niobium, cobalt iron boron and alloys of these materials. Other magnetic materials used in the MRAM fabrication industry may also be used for the storage layer and the reference layer. It is noted that the storage layer and the reference layer each may include multiple layers of materials. The tunnel layer may be made from dielectric materials, such as silicon oxide ($SiO_2$), magnesium oxide (MgO), silicon nitride ($SiN_2$), aluminum oxide ($Al_2O_3$), aluminum nitride ($AlN_x$) and tantalum oxide ($TaO_x$), or can be made from non-magnetic materials, such as copper, gold and silver.

In one embodiment, the magnetoresistive memory cell is a thermal select magnetoresistive memory cell. The magnetoresistive reference memory cell is also a thermal select magnetoresistive reference memory cell in another embodiment. The memory cell and the reference memory cell may be selected to be other types of magnetoresistive memory cells, such as spin torque MRAM and Stoner-Wohlfarth MRAM, in other embodiments.

In another embodiment, the memory cell and the reference memory cell may be selected to be of a different type of memory cell. The reference memory cell may store a reference value used to determine the memory cell status of the memory cell.

According to one embodiment, the magnetoresistive reference memory cell has a pinning structure pinning the magnetic orientation of a storage layer of the magnetoresistive reference memory cell. The magnetic orientation of the storage layer is configured so as to represent the intermediate memory cell status of the magnetoresistive reference memory cell. For example, if the first memory cell status and the second memory cell status are respectively represented by pinning the magnetic orientation of the storage layer to be parallel and anti-parallel to the magnetic orientation of the reference layer, the intermediate memory cell status may be represented by pinning the magnetic orientation of the storage layer to be perpendicular to the magnetic orientation of the reference layer.

In one embodiment, the pinning structure may be a first antiferromagnetic layer coupled to the storage layer of the magnetoresistive memory cells, which has a first blocking temperature. A second antiferromagnetic layer may be coupled to a reference layer of the magnetoresistive memory cells as another pinning layer, which has a second blocking temperature. The two antiferromagnetic layers may be made from different antiferromagnetic materials such that the first blocking temperature is much lower than the second blocking temperature. Furthermore, the material for the first antiferromagnetic layer may be selected such that the first blocking temperature is in a suitable range in consideration of the operating temperature range of the magnetoresistive memory cells. Examples of the antiferromagnetic materials for the first antiferromagnetic layer include alloys of iridium—manganese and iron—manganese. Examples of the antiferromagnetic materials for the second antiferromagnetic layer may include alloys of platinum-manganese, nickel—manganese, osmium—manganese, platinum—palladium—manganese and platinum—manganese—chromium. In general, the blocking temperature for an antiferromagnetic layer increases with the thickness of the layer. Accordingly, it may be provided for the second antiferromagnetic layer to have a relatively larger thickness than the first antiferromagnetic layer (in which case, e.g., the first antiferromagnetic layer and the second antiferromagnetic layer may be made of the same material).

In one embodiment of the invention, the memory cell of the integrated circuit is a resistive memory cell. Examples of resistive memory cells include solid state electrolyte random access memory cell, phase change random access memory (PCRAM) cell, and transition metal oxide random access memory cell.

In one example, the resistive memory cell is a solid state electrolyte memory cell, which is also called conductive bridging random access memory (CBRAM) cell or programmable metallization cell (PMC). In a memory cell of this type, a vitreous or porous layer, for example made of chalcogenide glass such as germanium-sulfide (GeS), germanium-selenide (GeSe), tungsten oxide ($WO_x$) or copper sulfide (CuS), etc., may be arranged between a metal electrode serving as an ion donor, for example, made of Cu, Ag, Au, Zn, and a counter-electrode made of inert material, for example, W, Ti, Ta, TiN, doped Si or Pt. When a voltage or current pulse is applied between the electrodes, metal ions are driven into the chalcogenide glass by a redox reaction and form metal-enriched clusters. As a result of giving a sufficient metal concentration, a conductive bridge may be formed between the two electrodes, which forms a low-resistance or "on" state of the memory cell. An electrical current or voltage pulse having opposite polarity inverts the redox reaction, so that the metal ions are drawn from the chalcogenide glass and the metal-enriched clusters are reduced. In this way, the metallically conductive bridge is terminated, and a high-resistance or "off" state of the memory cell then forms.

In another example, the resistive memory cell is a phase change memory cell, which, e.g., uses a medium called chalcogenide, a glassy substance containing sulphur, selenium, germanium and/or tellurium. These silvery semiconductors have the unique property that their physical state (i.e., the arrangement of their atoms) can be changed from crystalline to amorphous through the application of heat. The two states have very different electrical resistance properties that can easily be measured, making the phase change material, e.g., chalcogenide, suitable for data storage.

According to one embodiment, the reference memory cell may be a resistive reference memory cell. The reference memory cell may be of a type selected from a group of resistive reference memory cell types. In one example, the resistive reference memory cell is selected to be a solid state electrolyte reference memory cell. In another example, the resistive reference memory cell is a phase change reference memory cell.

The integrated circuit of one embodiment may further include a sense amplifier coupled to the memory cell and the reference memory cell. The sense amplifier may be configured to sense the memory cell status of the memory cell to, for example, read the data stored in the memory cell.

In one embodiment of the invention, the integrated circuit may include a plurality of memory cells. The plurality of memory cells may be grouped into a plurality of memory cell groups, wherein each memory cell group includes a plurality of memory cells. According to an embodiment of the invention, at least one reference memory cell is assigned to each memory cell group of the plurality of memory cell groups. More than one reference memory cell may be assigned to each memory cell group in another embodiment. For example, one reference memory cell is assigned to each memory cell in each memory cell group.

The integrated circuit may also include a heater heating the memory cell. For example, if the memory cell is a thermal select magnetoresistive memory cell, the heater may heat the memory cell above its blocking temperature to facilitate the programming of the memory cell. In another embodiment, the integrated circuit may also include a heater heating the reference memory cell, which is, for example, in the pre-programming of the reference memory cell with the intermediate memory cell status.

Another embodiment of the present invention relates to a cell arrangement including at least one memory cell and at least one reference cell. The memory cell has at least a first memory cell status and a second memory cell status. The reference cell is set to an intermediate memory cell status between the first memory cell status and the second memory cell status.

A further embodiment of the present invention relates to an integrated circuit having a cell arrangement. The cell arrangement includes at least one memory cell and at least one reference cell, wherein the reference cell is set to an intermediate memory cell status.

A still further embodiment of the present invention relates to a method of manufacturing an integrated circuit having a cell arrangement. At least one memory cell having at least a first memory cell status and a second memory cell status is formed. At least one reference memory cell is also formed, and set to an intermediate memory cell status between the first memory cell status and the second memory cell status.

In one embodiment, the memory cell is a multi-level memory cell, wherein a single cell may store or represent more than a single bit of data. In another embodiment, the memory cell is a multi-bit memory cell, which is configured to store a plurality of bits by spatially separated electric charge storage regions or separated data storage layers, for example.

In an embodiment, the memory cell and the reference memory cell are formed as the same type of memory cell, selected from a plurality of types of memory cells including magnetoresitive memory cell, flash memory cell, resistive memory cell, etc.

In one embodiment, the memory cell is formed as a magnetoresistive memory cell. In another embodiment, the reference memory cell is also formed as a magnetoresistive reference memory cell, being the same type of the memory cell with the at least one memory cell. The memory cell may be formed as one type of magnetoresistive memory cells selected from a plurality of types of magnetoresistive memory cells including thermal select MRAM, spin torque MRAM and Stoner-Wohlfarth MRAM. For example, the memory cell is formed as a thermal select magnetoresistive memory cell. In another example, the magnetoresistive reference memory cell is formed as a thermal select magnetoresistive reference memory cell as well.

According to one embodiment, the magnetoresistive reference memory cell is formed with a pinning structure pinning the magnetic orientation of a storage layer of the magnetoresistive reference memory cell. The magnetic orientation of the storage layer is configured to represent the intermediate memory cell status of the magnetoresistive reference memory cell, for example, the intermediate memory cell status between logic state "0" and logic state "1".

The method of manufacturing the integrated circuit according to an embodiment further includes forming a sense amplifier coupled to the memory cell and the reference memory cell. The sense amplifier is configured to sense the memory cell status of the memory cell.

One embodiment of the present invention further relates to a method of reading a memory cell status of a memory cell. According to this embodiment, a characteristic of the memory cell is detected, wherein the characteristic is representative of a memory cell status of the memory cell. A reference characteristic of a reference memory cell may also be detected, the reference characteristic being representative of an intermediate memory cell status of the reference memory cell. The detected characteristic of the memory cell is compared with the detected reference characteristic of the reference memory cell, thereby determining the memory cell status of the memory cell.

A further embodiment of the invention relates to a memory module including a plurality of integrated circuits, wherein at least one integrated circuit of the plurality of integrated circuits includes a cell arrangement. The cell arrangement includes at least one memory cell having at least a first memory cell status and a second memory cell status. The cell arrangement further includes at least one reference cell, wherein the reference cell is set to an intermediate memory cell status between the first memory cell status and the second memory cell status.

The memory module may be a stackable memory module, wherein at least some of the integrated circuits are stacked one above the other, according to an embodiment of the invention.

FIG. 2 shows an integrated circuit having a one-reference-cell design 200 according to an embodiment of the invention. A memory cell array 202 comprises a plurality of memory cells, including data memory cells for storing data and reference memory cells to be used in a reading operation. A reference cell 204 may be connected with a data cell 208 through a read word line (RWL) 210, acting as a reference when reading the memory cell status of the data cell 208. To be used as a reference, in an embodiment of the invention, the reference cell 204 is pre-programmed into an intermediate memory cell status.

In one embodiment of the invention, if the first cell memory cell status of the data cell 208 corresponds to a resistance $R_{min}$ of the data cell 208, and the second memory cell status of the data cell 208 corresponds to a resistance $R_{max}$ of the data cell 208, the reference cell 204 may be programmed to the intermediate memory cell status corresponding to a resistance intermediate between $R_{min}$ and $R_{max}$, e.g., corresponding to a resistance $(R_{min}+R_{max})/2$.

The reference cell 204 and the data cell 208 are also connected to a reference bit line 214 and a bit line 218, respectively. A plurality of data cells are connected to the bit line 214, wherein each data cell is connected to a different read word line. In one example, a plurality of reference cells are connected to the same reference bit line 214 and are pre-programmed to the same intermediate memory cell status. By selecting the respective read word line 210 and bit line connected to the data cell 208 and the reference cell 204, the memory cell status of the data cell 208 is sensed and compared with the reference memory cell status of the reference cell 204. It is also possible in another example to have only one reference cell connected to one read word line and one reference bit line, to be used as the reference for all the data cells in the cell array.

In an embodiment of the invention, a column selector 220 is connected to the reference bit line 214 and the bit line 218, and selects the respective bit line by applying a column select signal to a respective transistor 222 connected to the respective bit line. When the selected RWL 210 is driven high, the data cell 208 and the reference cell 204 are connected to their respective selected bit lines 218 and 214.

In an embodiment of the invention, a sense amplifier 230 is connected to the reference bit line 214 and the bit line 218 via the column selector 220, wherein the sense amplifier 230 comprises a plurality of bit line clamp transistors 232 (wherein in one embodiment of the invention, one clamp transistor 232 may be provided for each of the bit lines 218 and the reference bit line 214). The bit line clamp transistors 232 are gated by a bit line clamp voltage, and hold the bit lines 218 and the reference bit line 214 at the desired read voltage. The drain of each bit line clamp transistor 232 is connected to a load device $R_L$ 234. The load device $R_L$ 234 serves to convert the current signal into a voltage signal that is sensed by a differential voltage amplifier 236 to obtain a sense amplifier output signal 240, representing the memory cell status of the selected data cell 208.

There may be a plurality of data cells 208 (not shown in FIG. 2) coupled to the same read word line 210, such that the reference cell 204 is used as the reference for all the data cells 208 coupled to the same read word line 210. Thus, a high density of the integrated circuit 200 and a lower power consumption can be achieved.

The memory cell status of the memory cell and the reference memory cell according to an embodiment of the invention is illustrated in FIG. 3A.

In this example, the memory cell and the reference memory cell are selected to be thermal select magnetoresistive memory cell. The memory cell may have two memory cell status, which are determined by detecting the resistance of the memory cell. The first memory cell status 310 corresponds to the lowest resistance $R_{min}$, wherein the magnetization orientation of the storage layer of the memory cell is parallel (0°) to the magnetization orientation of the reference layer of the memory cell. The second memory cell status 320 corresponds to the highest resistance $R_{max}$, wherein the magnetization orientation of the storage layer of the memory cell is anti-parallel (180°) to the magnetization orientation of the reference layer of the memory cell. The reference memory cell as used in this embodiment has a pinning layer above its storage layer, in order to be set to a predetermined intermediate resistance. For example, the antiferromagnetic pinning layer may be configured to have a particular pinning direction, such that the magnetization orientation of the storage layer is frozen close to 90° relative to the magnetization orientation of the reference layer of the reference memory cell. Thus, the reference resistance of the reference memory cell is about $(R_{max}+R_{min})/2$, and can be used to determine the memory cell status of the memory cell. For example, if the detected resistance of the memory cell is larger than the reference resistance, the memory cell status of the memory cell is determined to be the second memory cell status 320.

In this context it should be mentioned that an alternative embodiment of the invention also includes perpendicular thermal select magnetoresistive memory cells.

FIG. 3B shows an intermediate state 352 used as the reference for the first state "0" 354 and the second state "1" 356. It is observed that the reference cell with the intermediate state 352 has excellent data retention at presence of strong field stress, which demonstrates feasibility of using reference cells with intermediate memory cell status. This may be achieved by, for example, choosing antiferromagnetic material for the pinning layer of the reference cell to have a relative high blocking temperature, so as to be robust to the field and heat stress in operating the MRAM device.

FIG. 4 shows one example of the memory cell 400 or the reference memory cell 400 according to one embodiment of the invention. The memory cell 400 or the reference cell 400 is a thermal select magnetoresistive memory cell in the 1T1MTJ (one transistor, one magnetic tunnel junction) structure. In an embodiment of the invention, the MTJ stack 402 includes a storage layer 404, a tunnel barrier layer 406 and a reference layer 408. The storage layer 404 has a switchable magnetic orientation, while the reference layer 408 has a fixed magnetic orientation.

A bit line 410 is coupled to the MTJ stack 402 next to its storage layer 404. A write word line 412 and a read word line 414, arranged parallel to each other while perpendicular to the bit line 410, are coupled to the MTJ stack 402 next to the reference layer 408 side of the MTJ 402 without direct contact. The write word line 412 and the read word line 414 may be parallel to each other in a vertical direction as an example shown in FIG. 4, or may be parallel to each other in a horizontal direction depending on the design of the cell structure. The read word line 414 is connected to the gate of a transistor 416 to activate the MTJ 402 for reading and writing operation. The drain of the transistor 416 is connected to the reference layer 408 of the MTJ through a conductive structure 418 and an interconnect layer 420. The conductive structure 418 may be a single conductive layer, or may include various vias, interconnects and additional conductive structures. The source of the transistor 416 is grounded, in general, connected to a reference potential. It is to be noted that various types of transistors may be used depending on the design of the circuit, wherein the connected component of the source, drain and gate of the transistors will be changed correspondingly.

In an example, the storage layer 404 and the reference layer 408 may each include multiple layers, including a pinning layer structure. The pinning layer structure of the storage layer 404 may have a lower blocking temperature than the pinning layer structure of the reference layer 408.

To program the reference memory cell 400 with an intermediate memory cell status, the read word line 414 is driven high to switch on the transistor 416, and the current is provided by the bit line 410 to heat the reference memory cell 400 to be programmed. Furthermore, current with a particular direction flowing through the write word line 412 generates a magnetic field, which serves to change the magnetization orientation of the storage layer 404. When the magnetization orientation of the storage layer arrives at a predetermined angle, e.g., 90°, relative to the magnetization orientation of the reference layer, the heating of the MTJ 402 is stopped and the magnetization orientation of storage layer is fixed. In other words, illustratively, in an embodiment of the invention, the heating pulse or heating pulses is/are completed (in other words ended) before the magnetic field pulse or magnetic field pulses is/are completed (in other words ended). Accordingly, the reference memory cell 400 is programmed to an intermediate memory cell status.

In another example, when reading a data memory cell 400, the read word line 414 is driven high to switch on the transistor 416, and the bit line 410 is selected by a column selector. A sense amplifier connected to the bit line 410 is used to sense a characteristic of the data memory cell 400, e.g., the current flowing through the data memory cell 400, in order to determine the memory cell status of the data memory cell 400.

Figure 5:
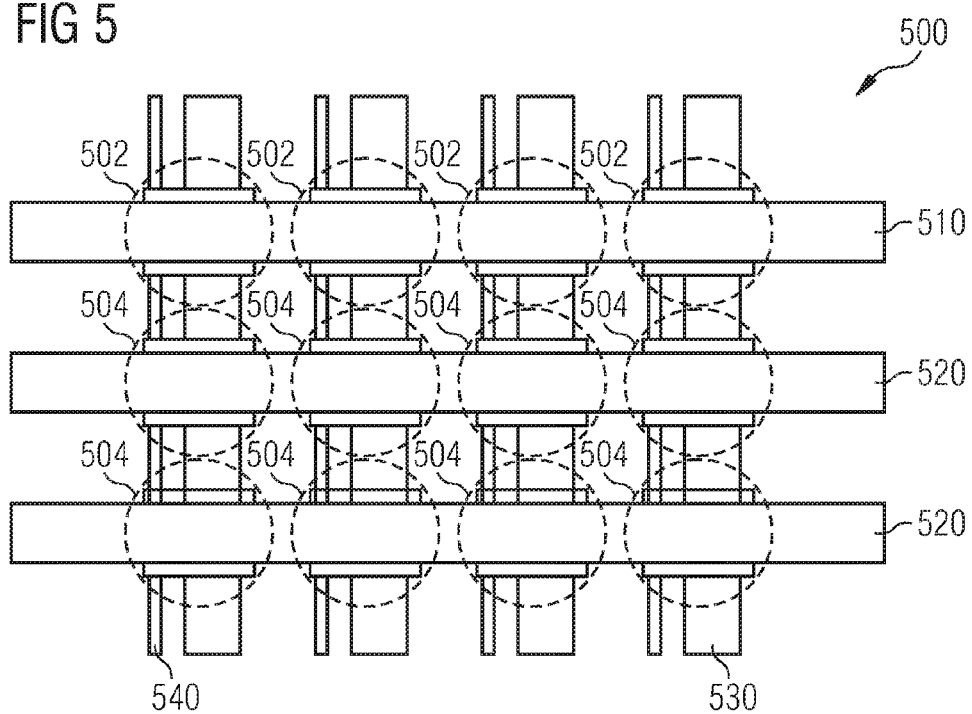
FIG. 5 shows a cell array structure according to an embodiment of the invention.

FIG. 5 shows a cell array 500 according to one embodiment of the invention. The reference cells 502 and the memory cells 504 are coupled to reference bit lines 510 and bit lines 520, respectively. The reference cells 502 are placed at the intersection of the reference bit lines 510 and write word lines 530, and the memory cells 504 are placed at the intersection of the bit lines 520 and write word lines 530. Read word lines 540 extend parallel to the write word lines 530. The order of the bit lines 510, 520, write word lines 530 and read word lines 540 may be different in different circuit designs such that the bit lines 510, 520 are arranged below the cells, and the write word lines 530 and read word lines 540 are arranged above the cells.

In FIG. 5, there is a reference cell 502 connected to a plurality of memory cells 504 through the same read word line 540, such that any of these memory cells 504 can be read together with the reference cell 502 by selecting the read word line 540 coupled thereto. The reference cell 502 is connected to these memory cells 504 through the same read word line 540 to simplify the circuit design. It is also possible for the reference cell 502 and the memory cells 504 to be connected to different read word line 540.

In another example which is not shown in FIG. 5, only one reference cell 502 is assigned to a plurality of memory cells 504 arranged in a matrix form array. The reference cell 502 may be arranged external or internal to the cell array of the memory cells 504.

In another embodiment of the invention, the memory cells may be multi-level or multi-bit memory cells.

Figure 6:
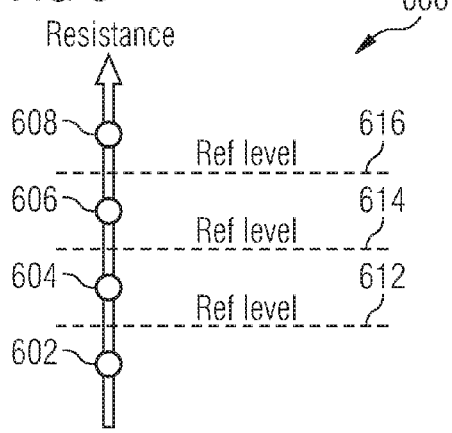
FIG. 6 shows resistance states and reference levels of a multi-level memory cell according to an embodiment of the invention.

The resistance states of a 4-level thermal select magnetoresistive memory cell are shown in a diagram 600 in FIG. 6.

A first resistance state 602 represent a first logic value "00", a second resistance state 604 represent a second logic value "01", a third resistance state 606 represent a third logic value "10" and a fourth resistance state 608 represent a fourth logic value "11". The four logic values represent the four memory cell status of the memory cell. To determine the memory cell status of the memory cell, three reference levels 612, 614 and 616 representing intermediate reference states between the four resistance states 602, 604, 606, 608 may be provided in an embodiment of the invention.

Figure 7:
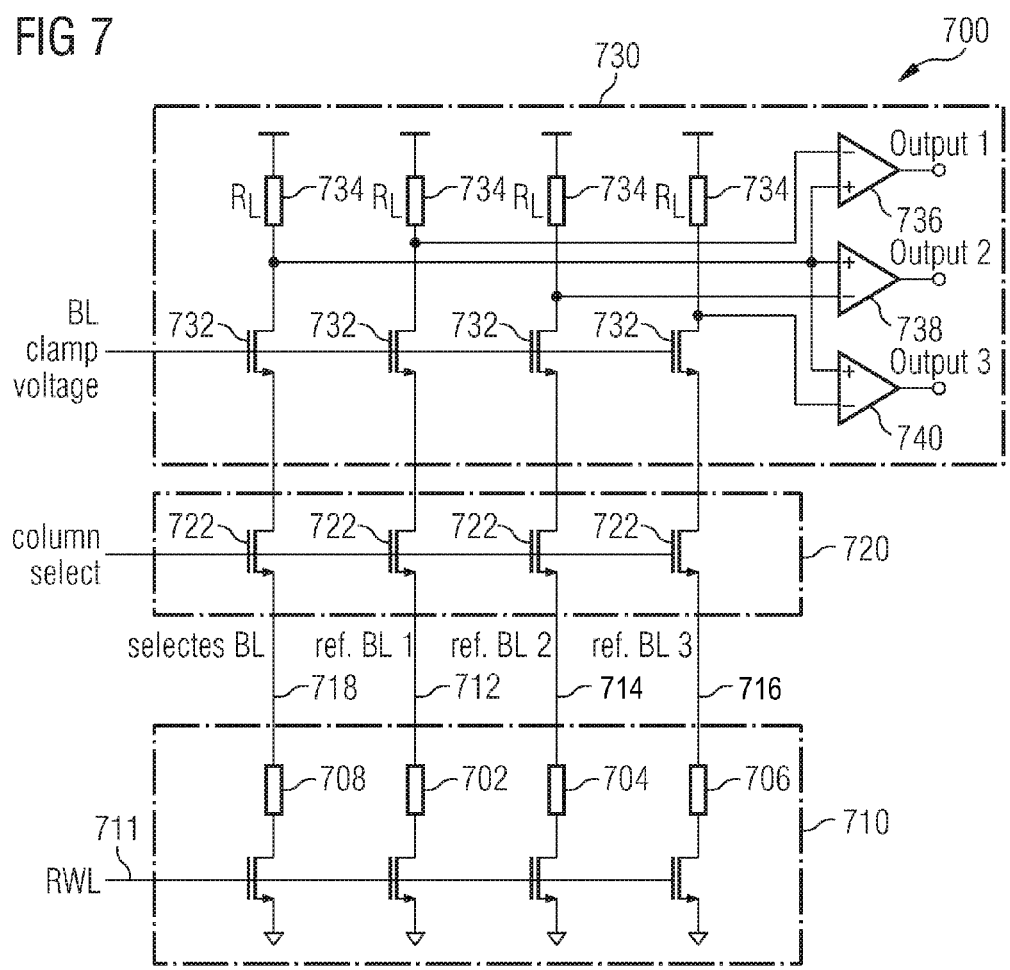
FIG. 7 shows a reading circuit for a multi-level memory cell according to an embodiment of the invention.

An integrated circuit 700 for reading memory cells according to an embodiment of the present invention is shown in FIG. 7.

In an embodiment of the invention, a memory cell array 710 includes a plurality of memory cells, including data memory cells 708 for storing data and reference memory cells 702, 704, 706 for reading operation. The reference cells 702, 704 and 706 are connected with the data cell 708 through a read word line (RWL) 711, and act as reference levels when determining the memory cell status of a multi-level data cell 708. The reference cells 702, 704, 706 are pre-programmed into a respective intermediate memory cell status.

In this example, the data cells 708 are 4-level thermal select magnetoresistive memory cells. The four memory levels of the data cell 708 correspond to a first resistance $R_{min}$, a second resistance $R_{min}+(R_{max}-R_{min})/3$, a third resistance $R_{min}+2(R_{max}-R_{min})/3$ and a fourth resistance $R_{max}$, respectively. Accordingly, a first reference cell 702 is programmed to have an intermediate resistance $R_{min}+(R_{max}-R_{min})/6$, a second reference cell 704 is programmed to have a resistance $R_{min}+(R_{max}-R_{min})/2$, and a third reference cell 706 is programmed to have a resistance $R_{min}+5(R_{max}-R_{min})/6$. The reference cells 702, 704, 706 are selected to be thermal select magnetoresistive memory cells, such that the magnetic orientation of the storage layer of the respective reference cell can be adjusted to a desired intermediate status through control over a pinning structure of the reference cells.

The reference cells 702, 704, 706 and the data cell 708 are also connected to reference bit line 712, 714, 716 and a bit line 718, respectively. A plurality of data cells 708 are connected to the bit line 718, wherein each data cell is connected to a different read word line. In one example, a plurality of reference cells are connected to a reference bit line and are pre-programmed to the same intermediate memory cell status. By selecting the respective read word line and bit line are connected to the data cell 708 and the reference cells 702, 704, 706, the memory cell status of the data cell 708 is sensed and compared with the memory cell status of the reference cells 702, 704, 706. It is also possible in another example to have only one reference cell connected to one read word line and one reference bit line, being used as the reference for all the data cells in the cell array.

A column selector 720 is connected to the bit lines 712, 714, 716, 718 and selects the respective bit line by applying a column select signal to a respective transistor 722 connected to the respective bit line. When the selected RWL 711 is driven high, the data cell 708 and the reference cells 702, 704, 706 are connected to their respective selected bit lines 718 and 712, 714, 716. A sense amplifier 730 comprises bit line clamp transistors 732, which are gated by a bit line clamp voltage and holds the bit lines 718 and 712, 714, 716 at the desired read voltage. The drain of each bit line clamp transistor 732 is connected to a load device $R_L$ 734. The load devices $R_L$ 734 convert the current signals into voltage signals, which correspond to the data cell 708 and the reference cells 702, 704, 706, respectively. The voltage signal corresponding to the data cell 708 is compared with the voltage signals corresponding to the reference cells 702, 704, 706 by three differential voltage amplifiers 736, 738 and 740 to obtain three sense amplifier output signals. The three output signals may be input to a detector to determine the memory cell status of the data cell 708. The detector may be composed of logic gates, a processor or a controller.

Figure 8:
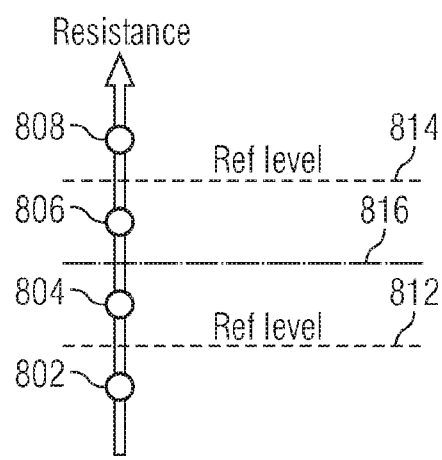
FIG. 8 shows resistance states and reference levels of a multi-level memory cell according to another embodiment of the invention.

In another example as shown in FIG. 8, only two reference cells with reference levels 812 and 814 are used as reference for a 4-level memory cell having 4 resistance status 802, 804, 806 and 808. In such a case, the third reference level 816 is generated by taking an average of the two reference levels 812 and 814. Thus, less reference cells are used to achieve a high density of the MRAM device.

Figure 9:
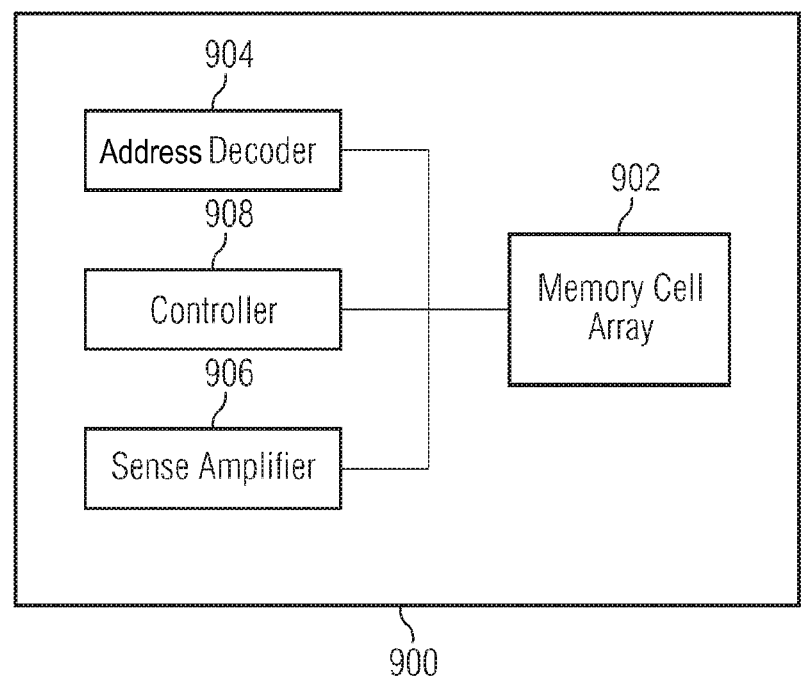
FIG. 9 shows an integrated circuit according to one embodiment of the invention.

FIG. 9 illustrates an integrated circuit in accordance with an exemplary embodiment of the invention.

In an embodiment of the invention, the integrated circuit includes a cell arrangement 900, which includes memory cells and peripherial devices.

According to an embodiment of the invention, the cell arrangement 900 has a memory cell array 902 which includes at least one memory cell and at least one reference memory cell. The memory cells and the reference memory cells may be arranged in rows and columns in a matrix form. In an embodiment of the invention, the at least one reference memory cell may be selected to be of the same type as the memory cell(s), for example, thermal select magnetoresistive memory cells. The reference memory cells are pre-programmed to intermediate memory cell status. It should be mentioned that the memory cells and the reference memory cells in the memory cell array 902 may be arranged in a different way than in a matrix form, for example in a zig-zag architecture.

In addition to the memory cell array 902, the integrated circuit may include an address decoder 904, which receives a logic address of a memory cell to be selected, for example, a memory cell or a reference memory cell to be programmed, read or erased, and maps the logic address of the memory cell to the actual physical address of the memory cell to be selected within the memory cell array 902. Furthermore, the address decoder 904 provides the select signal to word lines and bit lines, to which the memory cell to be selected is connected to such that the desired memory cell is selected.

In one embodiment of the invention, one or a plurality of sense amplifiers 906 (for example, one or more current amplifier(s) or one or more voltage amplifier(s)) which are used to sense and compare a characteristic of the selected reference memory cell and memory cell in the memory cell array 902.

Furthermore, a controller 908, for example a microprocessor, in an alternative embodiment of the invention implemented as hard wired logic, is provided. The controller 908 provides voltage signals in order to provide the required voltages and currents in order to perform the respectively selected operation on the selected memory cell and reference memory cell within the memory cell array 902. By way of example, the controller 908 provides a sequence of voltages and currents to a selected memory cell in order for example to align the magnetization of the selected memory cell. In another example, the controller 908 provides signals to read the memory cells and the reference memory cells in the memory cell array 902.

FIG. 10A shows a flow diagram 1000 illustrating a method of manufacturing an integrated circuit having a cell arrangement according to one embodiment of the invention.

In 1002, at least one memory cell having a first memory cell status and a second memory cell status is formed. At least one reference memory cell is then formed in 1004. The reference memory cell is set to an intermediate memory cell status between the first and the second memory cell status of the at least one memory cell in 1006.

In one embodiment, the reference memory cell is a thermal select magnetoresistive memory cell, which is set to an intermediate memory cell status with proper pinning direction of a pinning structure of the reference memory cell. In another embodiment, the reference memory cell may be set to an intermediate memory cell status, e.g., by rotation of the MTJ in shape towards the reference layer anneal direction in the printing of the reference memory cell. The setting of memory cell status of the reference memory cells can be performed at final test or during process annealing. It is noticed that the memory cell status of the reference memory cell may be set by applying either an external or internal magnetic field, when the reference memory cell is heated either internally or through annealing.

FIG. 10B shows a flow diagram 1050 illustrating a method of reading a memory cell status of a memory cell according to another embodiment of the invention.

A characteristic of the memory cell is detected in 1052, wherein the characteristic is representative of a memory cell status of the memory cell. A reference characteristic of a reference memory cell is detected in 1054, wherein the reference characteristic is representative of an intermediate memory cell status of the reference memory cell. The detected characteristic of the memory cell is then compared with the detected reference characteristic of the reference memory cell in 1056, thereby determining the memory cell status of the memory cell.

In one embodiment, the characteristic of the memory cell and the reference characteristic of the reference cell may be current signal, voltage signals or resistance value detected by a sense amplifier. These characteristics represent the memory cell status of the memory cell and the reference memory cell.

Figure 11A:
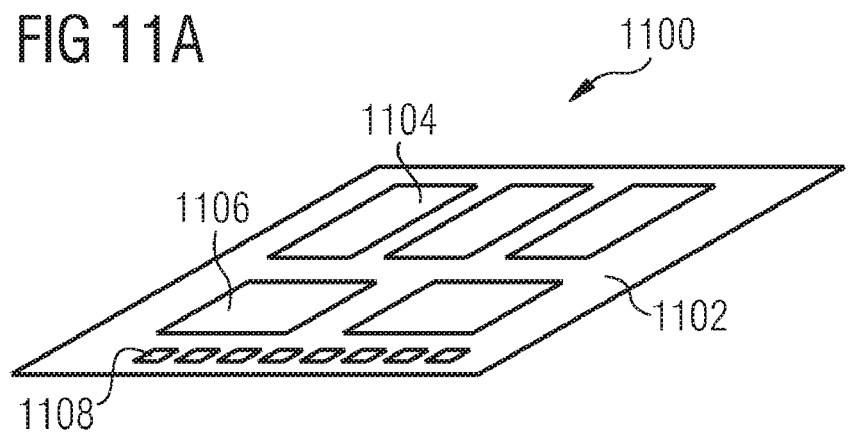
FIGS. 11A and 11B show a memory module and a stackable memory module, respectively, in accordance with an embodiment of the invention.
Figure 11B:
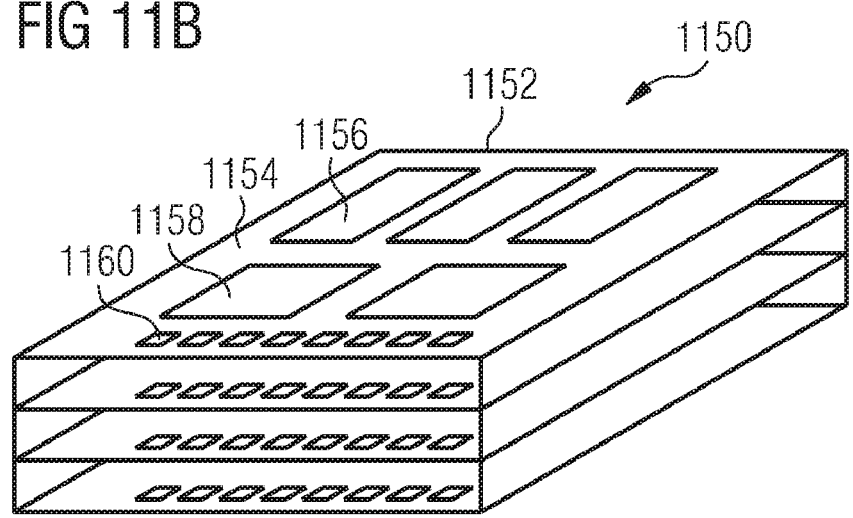

As shown in FIGS. 11A and 11B, in some embodiments, memory devices such as those described herein may be used in modules. In FIG. 11A, a memory module 1100 is shown, on which one or more memory device having memory cell arrays 1104 are arranged on a substrate 1102. The memory cell arrays 1104 may include numerous memory cells, e.g., the memory cells and the reference memory cells arranged in a predefined pattern in accordance with an embodiment of the invention. The reference memory cells are programmed to intermediate memory cell status between the memory cell status of the memory cells. The memory module 1100 may also include one or more electronic devices 1106, which may include memory, processing circuitry, control circuitry, addressing circuitry, detecting circuitry, comparing circuitry, bus interconnection circuitry, or other circuitry or electronic devices that may be combined on a module with a memory device, such as the memory device 1104. Additionally, the memory module 1100 includes multiple electrical connections 1108, which may be used to connect the memory module 1100 to other electronic components, including other modules.

As shown in FIG. 11B, in some embodiments, these modules may be stackable, to form a stack 1150. For example, a stackable memory module 1152 may contain one or more memory devices having memory cell arrays 1156, arranged on a stackable substrate 1154. The memory cell arrays 1156 contains memory cells and reference memory cells in accordance with an embodiment of the invention. The stackable memory module 1152 may also include one or more electronic devices 1158, which may include memory, processing circuitry, control circuitry, addressing circuitry, detecting circuitry, comparing circuitry, bus interconnection circuitry, or other circuitry or electronic devices that may be combined on a module with a memory device, such as the memory device 1156. Electrical connections 1160 are used to connect the stackable memory module 1152 with other modules in the stack 1150, or with other electronic devices. Other modules in the stack 1150 may include additional stackable memory modules, similar to the stackable memory module 1152 described above, or other types of stackable modules, such as stackable processing modules, control modules, communication modules, or other modules containing electronic components.

In an embodiment, an integrated circuit having a cell arrangement is provided. The cell arrangement may include a memory cell having a first memory cell status and a second memory cell status, and a reference cell, wherein the reference cell may be configured to be set to an intermediate memory cell status between the first memory cell status and the second memory cell status.

The memory cell may be a multi-level memory cell.

Furthermore, the memory cell may be a multi-bit memory cell.

In an example, the memory cell and the reference memory cell are of the same type of memory cell.

In another implementation, the memory cell is a magnetoresistive memory cell, for example, a thermal select magnetoresistive memory cell.

In another implementation, the reference memory cell is a magnetoresistive reference memory cell, for example, a thermal select magnetoresistive reference memory cell.

In an example, the magnetoresistive reference memory cell has a pinning structure pinning the magnetic orientation of a storage layer of the magnetoresistive reference memory cell, the magnetic orientation of the storage layer representing the intermediate memory cell status of the magnetoresistive reference memory cell.

The memory cell may be a resistive memory cell.

Furthermore, the resistive memory cell may be a solid state electrolyte memory cell.

Alternatively, the resistive memory cell may be a phase change memory cell.

In an example, the reference memory cell is a resistive reference memory cell.

Furthermore, the resistive reference memory cell may be a solid state electrolyte reference memory cell.

Alternatively, the resistive reference memory cell may be a phase change reference memory cell.

The integrated circuit may further include a sense amplifier coupled to the memory cell and the reference memory cell and sensing the memory cell status of the memory cell.

The integrated circuit may further include a plurality of memory cells.

In this example of the integrated circuit, the plurality of memory cells may be grouped into a plurality of memory cell groups, each memory cell group having a plurality of memory cells. At least one reference memory cell may be assigned to each memory cell group of the plurality of memory cell groups.

In another example, the integrated circuit may further include a heater configured to heat the memory cell.

In another example, the integrated circuit may further include a heater configured to heat the reference memory cell.

In another embodiment, a cell arrangement is provided. The cell arrangement may include a memory cell having a first memory cell status and a second memory cell status, and a reference cell, wherein the reference cell may be configured to be set to an intermediate memory cell status between the first memory cell status and the second memory cell status.

In another embodiment, an integrated circuit having a cell arrangement is provided. The cell arrangement may include a memory cell and a reference cell, wherein the reference cell may be configured to be set to an intermediate memory cell status.

In another embodiment, a method of manufacturing an integrated circuit having a cell arrangement is provided. The method may include forming a memory cell having a first memory cell status and a second memory cell status, and forming a reference memory cell, and setting the reference memory cell to an intermediate memory cell status between the first memory cell status and the second memory cell status.

The memory cell may be a multi-level memory cell.

Furthermore, the memory cell may be a multi-bit memory cell.

The memory cell and the reference memory cell may be formed as the same type of memory cell.

In an embodiment, the memory cell is formed as a magnetoresistive memory cell, for example, as a thermal select magnetoresistive memory cell.

In an embodiment, the reference memory cell is formed as a magnetoresistive reference memory cell, for example, as a thermal select magnetoresistive reference memory cell.

The magnetoresistive reference memory cell may be formed with a pinning structure pinning the magnetic orientation of a storage layer of the magnetoresistive reference memory cell, the magnetic orientation of the storage layer representing the intermediate memory cell status of the magnetoresistive reference memory cell.

The method may further include forming a sense amplifier coupled to the memory cell and the reference memory cell and sensing the memory cell status of the memory cell.

In another embodiment, a method of reading a memory cell status of a memory cell is provided. The method may include detecting a characteristic of the memory cell, wherein the characteristic is representative of a memory cell status of the memory cell, detecting a reference characteristic of a reference memory cell, wherein the reference characteristic is representative of an intermediate memory cell status of the reference memory cell, and comparing the detected characteristic of the memory cell with the detected reference characteristic of the reference memory cell, thereby determining the memory cell status of the memory cell.

In another embodiment, a memory module is provided. The memory module may include a plurality of integrated circuits, wherein an integrated circuit of the plurality of integrated circuits includes a cell arrangement. The cell arrangement may include a memory cell having a first memory cell status and a second memory cell status, and a reference cell, wherein the reference cell may be configured to be set to an intermediate memory cell status between the first memory cell status and the second memory cell status.

The memory module may be a stackable memory module in which at least some of the integrated circuits are stacked one above the other.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising:
    a magnetoresistive memory cell disposed in a substrate, the magnetoresistive memory cell having a first memory cell status and a second memory cell status; and
    a magnetoresistive reference cell disposed in the substrate, wherein the magnetoresistive reference cell is configured to be set to an intermediate memory cell status between the first memory cell status and the second memory cell status,
    wherein the magnetoresistive reference memory cell comprises a pinning structure pinning a magnetic orientation of a storage layer of the magnetoresistive reference memory cell, the magnetic orientation of the storage layer representing an intermediate memory cell status of the magnetoresistive reference memory cell.

2. The integrated circuit of claim 1, wherein the memory cell comprises a multi-level memory cell.

3. The integrated circuit of claim 1, wherein the memory cell comprises a multi-bit memory cell.

4. The integrated circuit of claim 1, wherein the magnetoresistive memory cell comprises a thermal select magnetoresistive memory cell.

5. The integrated circuit of claim 1, wherein the magnetoresistive reference memory cell comprises a thermal select magnetoresistive reference memory cell.

6. The integrated circuit of claim 1, further comprising a plurality of additional memory cells disposed in the substrate.

7. The integrated circuit of claim 6,
    wherein the additional memory cells and the memory cell are grouped into a plurality of memory cell groups, each memory cell group having a plurality of memory cells; and
    wherein a reference memory cell is assigned to each memory cell group of the plurality of memory cell groups.

8. The integrated circuit of claim 1, further comprising a heater configured to heat the memory cell.

9. A method of manufacturing an integrated circuit, the method comprising:
    forming a magnetoresistive memory cell and a magnetoresistive reference memory cell in a substrate, the magnetoresistive memory cell having a first memory cell status and a second memory cell status; and
    setting the magnetoresistive reference memory cell to an intermediate memory cell status between the first memory cell status and the second memory cell status
    forming the magnetoresistive memory cell with a pinning structure pinning a magnetic orientation of a storage layer of the magnetoresistive memory cell, the magnetic orientation of the storage layer representing an intermediate memory cell status of the magnetoresistive memory cell.

10. The method of claim 9, wherein the memory cell comprises a multi-level memory cell.

11. The method of claim 9, wherein the memory cell comprises a multi-bit memory cell.

12. The method of claim 9 wherein the magnetoresistive memory cell comprises a thermal select magnetoresistive memory cell.

13. A method of reading a memory cell status of a magnetoresistive memory cell, the method comprising:
    detecting a characteristic of the magnetoresistive memory cell, wherein the characteristic is representative of a memory cell status of the magnetoresistive memory cell;
    detecting a reference characteristic of a magnetoresistive reference memory cell, wherein the reference characteristic is representative of an intermediate memory cell status of the magnetoresistive reference memory cell; and
    comparing the detected characteristic of the magnetoresistive memory cell with the detected reference characteristic of the magnetoresistive reference memory cell, thereby determining the memory cell status of the magnetoresistive memory cell,
    wherein the magnetoresistive reference memory cell comprises a pinning structure pinning a magnetic orientation of a storage layer of the magnetoresistive reference memory cell, the magnetic orientation of the storage layer representing an intermediate memory cell status of the magnetoresistive reference memory cell.

14. A memory module, comprising:
    a plurality of integrated circuits, wherein an integrated circuit of the plurality of integrated circuits comprises a cell arrangement, the cell arrangement comprising:
        a magnetoresistive memory cell having a first memory cell status and a second memory cell status; and
        a magnetoresistive reference cell, wherein the reference cell is configured to be set to an intermediate memory cell status between the first memory cell status and the second memory cell status,
        wherein the magnetoresistive reference memory cell comprises a pinning structure pinning a magnetic orientation of a storage layer of the magnetoresistive reference memory cell, the magnetic orientation of the storage layer representing an intermediate memory cell status of the magnetoresistive reference memory cell.

* * * * *